US009541592B1

(12) United States Patent
Tsironis

(10) Patent No.: US 9,541,592 B1
(45) Date of Patent: Jan. 10, 2017

(54) NOISE PARAMETER MEASUREMENT SYSTEM

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 61 days.

(21) Appl. No.: 14/471,111

(22) Filed: Aug. 28, 2014

Related U.S. Application Data

(60) Provisional application No. 61/873,008, filed on Sep. 3, 2013.

(51) Int. Cl.
G01R 29/26 (2006.01)
G01R 31/26 (2014.01)
G01R 27/28 (2006.01)
G01R 31/28 (2006.01)

(52) U.S. Cl.
CPC .............. *G01R 29/26* (2013.01); *G01R 27/28* (2013.01); *G01R 31/2616* (2013.01); *G01R 31/2822* (2013.01)

(58) Field of Classification Search
CPC .............. G01R 29/26; G01R 31/2616; G01R 31/31709; G01R 31/2822; G01R 27/28
See application file for complete search history.

(56) References Cited

U.S. PATENT DOCUMENTS

| 6,509,743 | B1* | 1/2003 | Ferrero | G01R 31/2822 324/123 R |
| 7,038,468 | B2* | 5/2006 | Verspecht | G01R 27/28 324/638 |
| 7,282,926 | B1* | 10/2007 | Verspecht | H01P 5/04 324/637 |
| 7,548,069 | B2* | 6/2009 | Simpson | G01R 27/28 324/537 |
| 9,157,972 | B2* | 10/2015 | Hamamura | G01R 33/3642 |
| 2010/0030504 | A1 | 2/2010 | Simpson | |
| 2013/0197848 | A1* | 8/2013 | Sariaslani | G01R 29/26 702/111 |

OTHER PUBLICATIONS

H. Rothe and W.Dahlke, "Theory of noisy four poles", Proceedings of the IRE, Jun. 1956, p. 163.
"Friis, formulas for noise", http://en.wikipedia.org/wiki/Friis_formulas_for_noise.
Sischka, Franz, "Basics of S-parameters, part 1", Characterization handbook, Mar. 2002, pp. 1-2.

(Continued)

Primary Examiner — Michael Zarroli

(57) ABSTRACT

A noise parameter test setup allows accurately measuring the four noise parameters (Fmin, Rn, Γopt) of microwave transistors over a wide frequency range using two wideband directional couplers, instead of SPDT switches, to merge the s-parameter (signal) measurement path and the noise measurement path, avoiding thus the uncertainty of the switching repeatability of the SPDT switches and improving the measurement accuracy. Calibration of the system is the same as when using switches. Additional power control precautions of the VNA sources are necessary to avoid injecting large signal power into the sensitive noise receiver during s-parameter measurements and jamming the weak noise power during noise measurement.

9 Claims, 15 Drawing Sheets

(56) References Cited

OTHER PUBLICATIONS

"Understanding Noise Parameter Basics/Understanding Noise Parameter Measurements", Application Note AN60-040, http://www.modelithics.com/literature.asp, 2009, pp. 1-4.
R. Lane, "The determination of Device Noise Parameters", Proceedings IEEE, vol. 57, Aug. 1969, pp. 1461-1462.
"Noise Figure Measurement Accuracy—The Y-Factor Method", Agilent Application Note 57-2, http://cp.literature.agilent.com/litweb/pdf/5952-3706E.pdf, Feb. 2014, pp. 8-11.
"Applying Error Correction to Network Analyzer Measurements Available Gain in a transistor", Agilent AN 1287-3, EE 194 RF, Mar. 2002, p. 4, equation 2.
TRL Calibration: ECE 451 Automated Microwave Measurements; Jose E. Schutt-Aine, Oct. 1994.

* cited by examiner

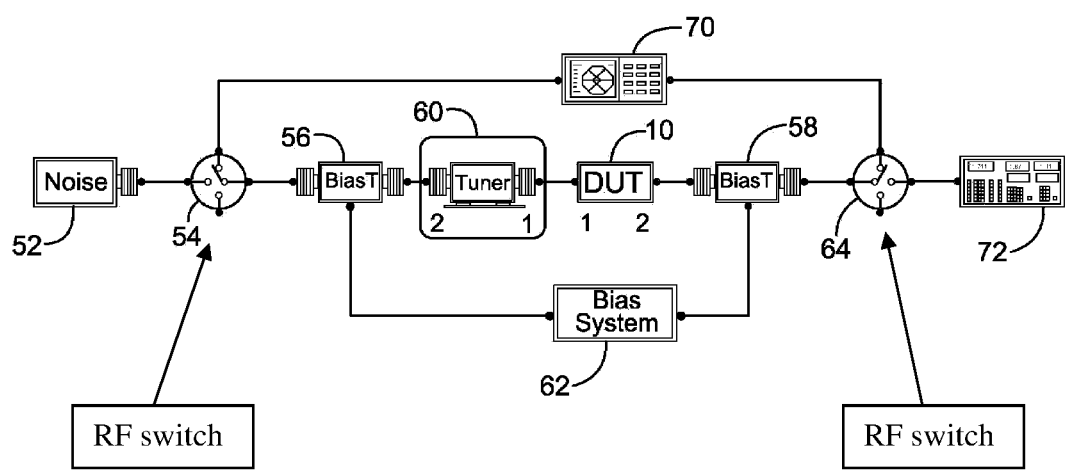
FIGURE 1: prior art

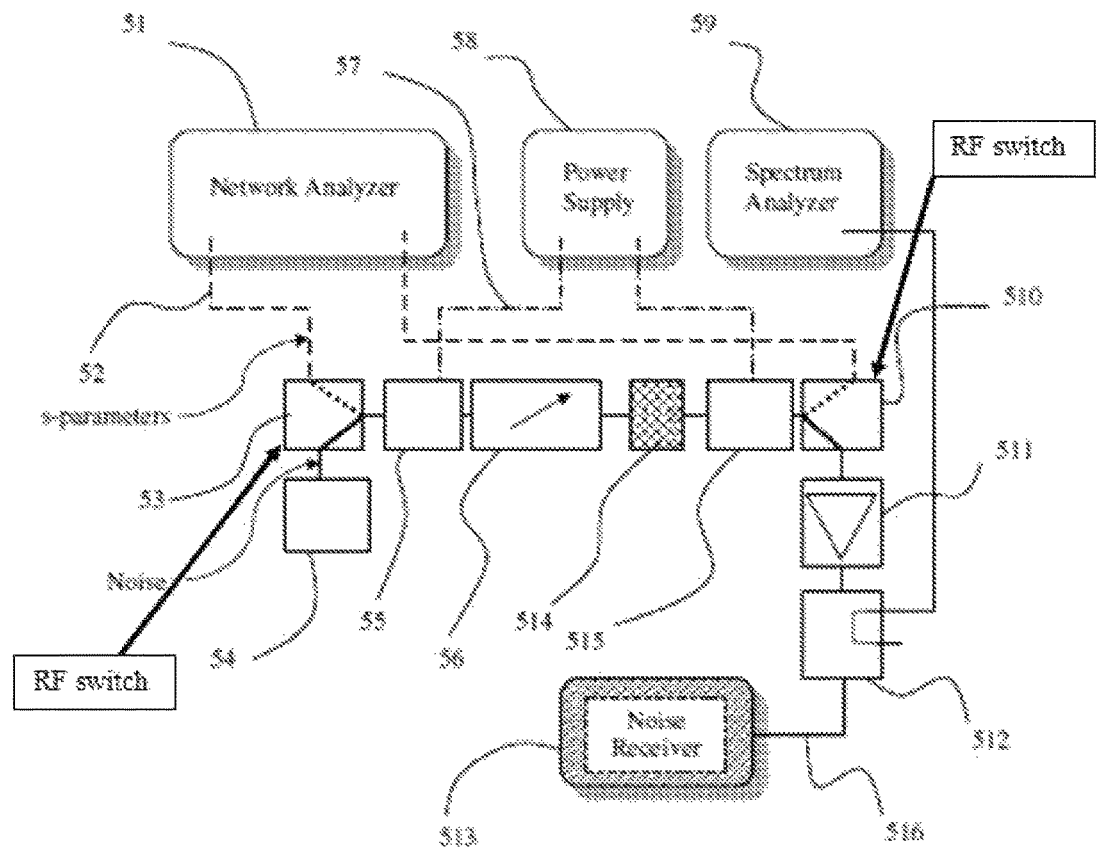
FIGURE 2: prior art

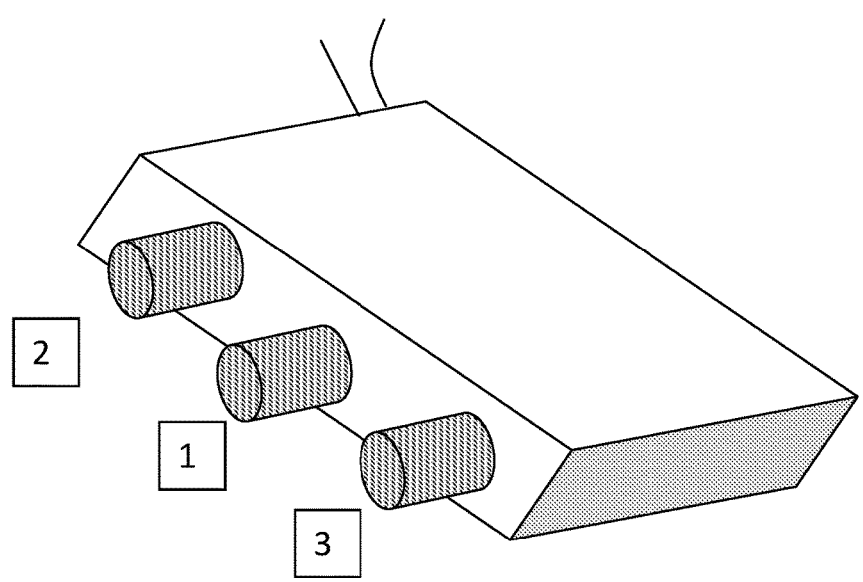
FIGURE 3: prior art

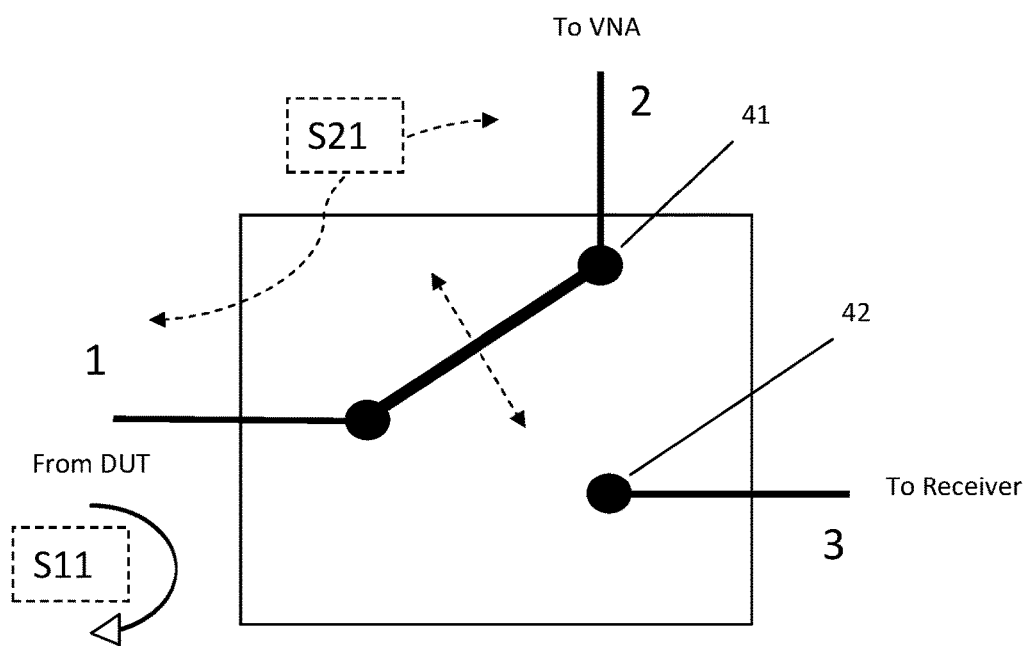
FIGURE 4: prior art

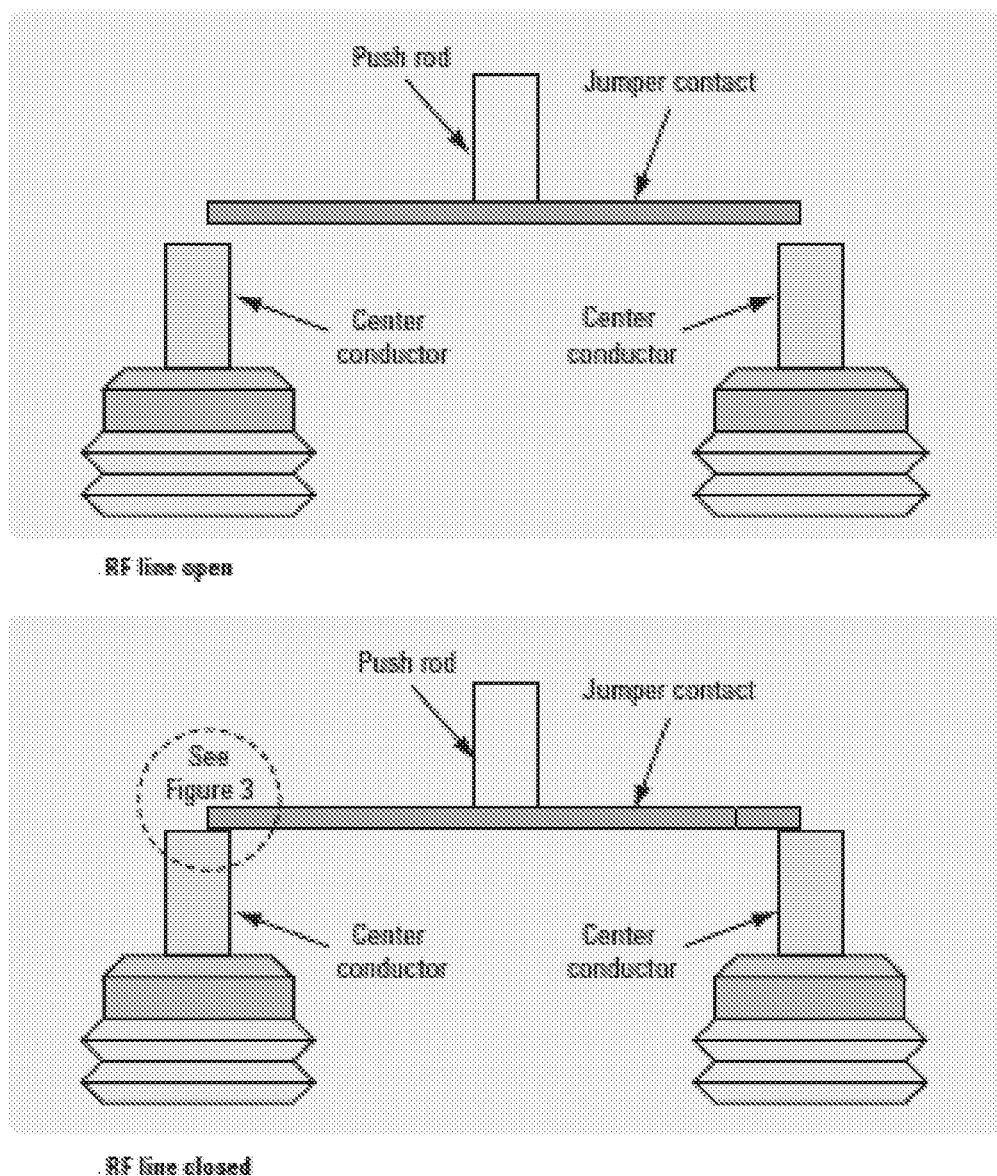
FIGURE 5: prior art a) 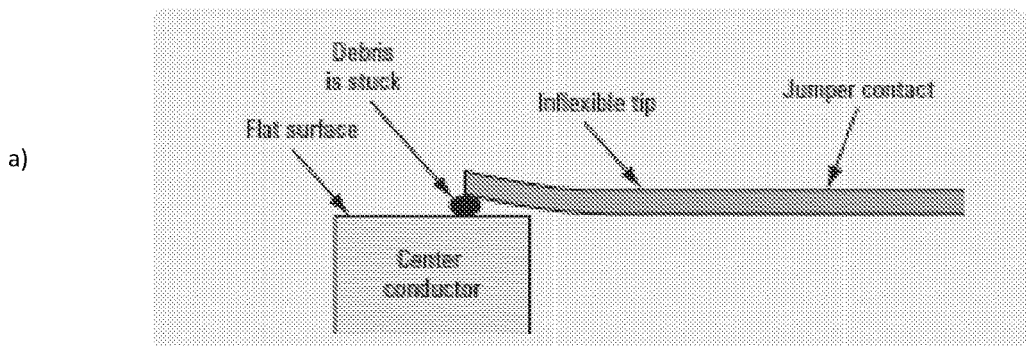
b) 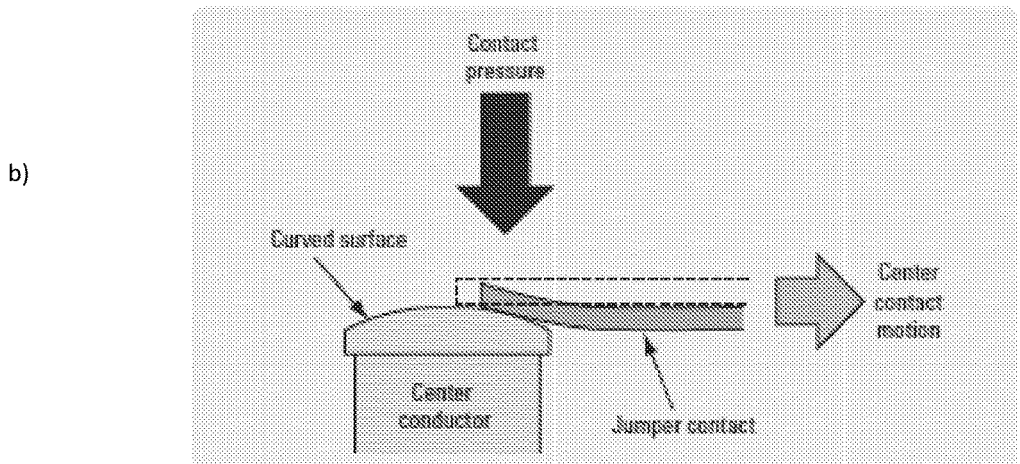
FIGURE 6: prior art

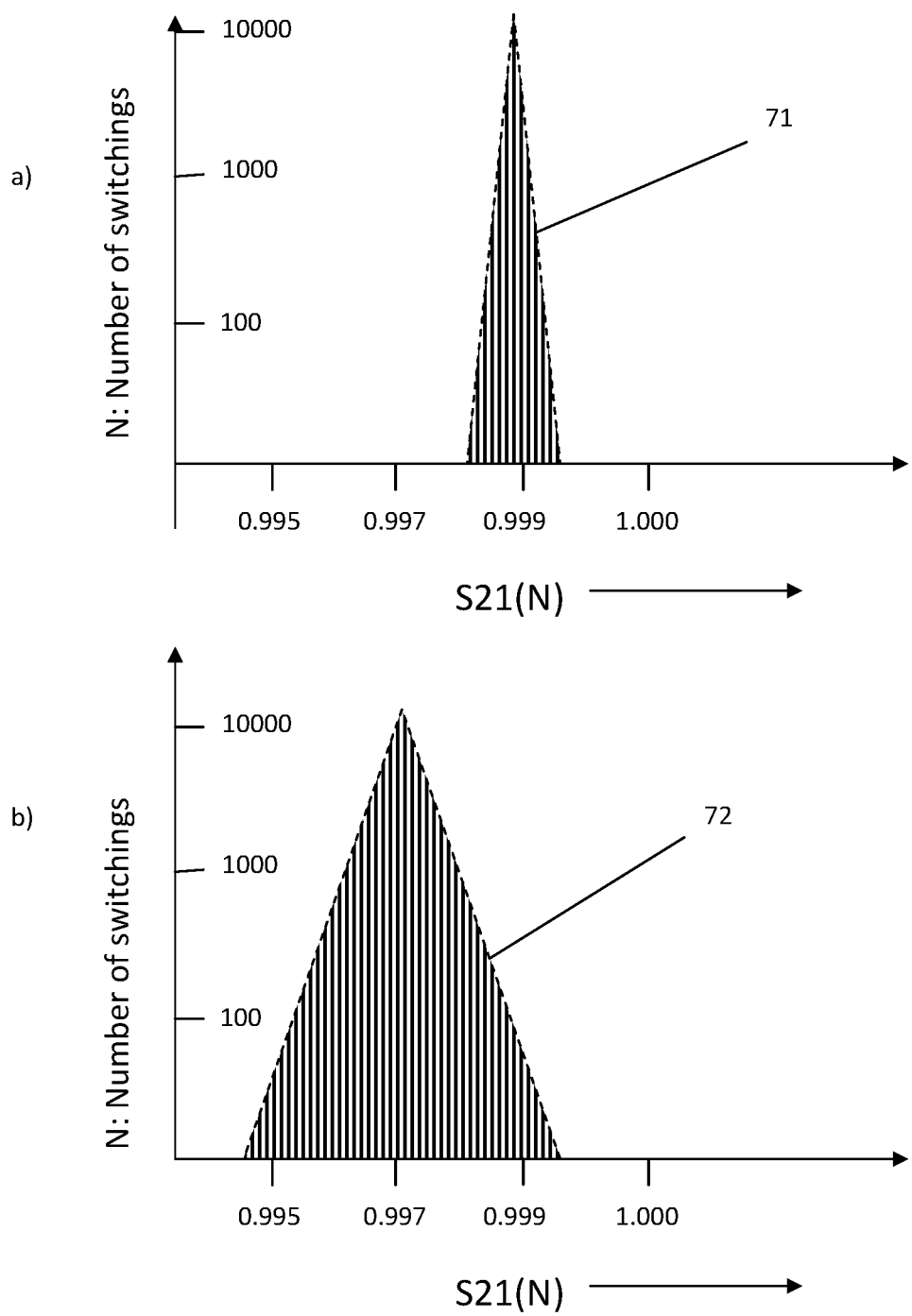
FIGURE 7: prior art

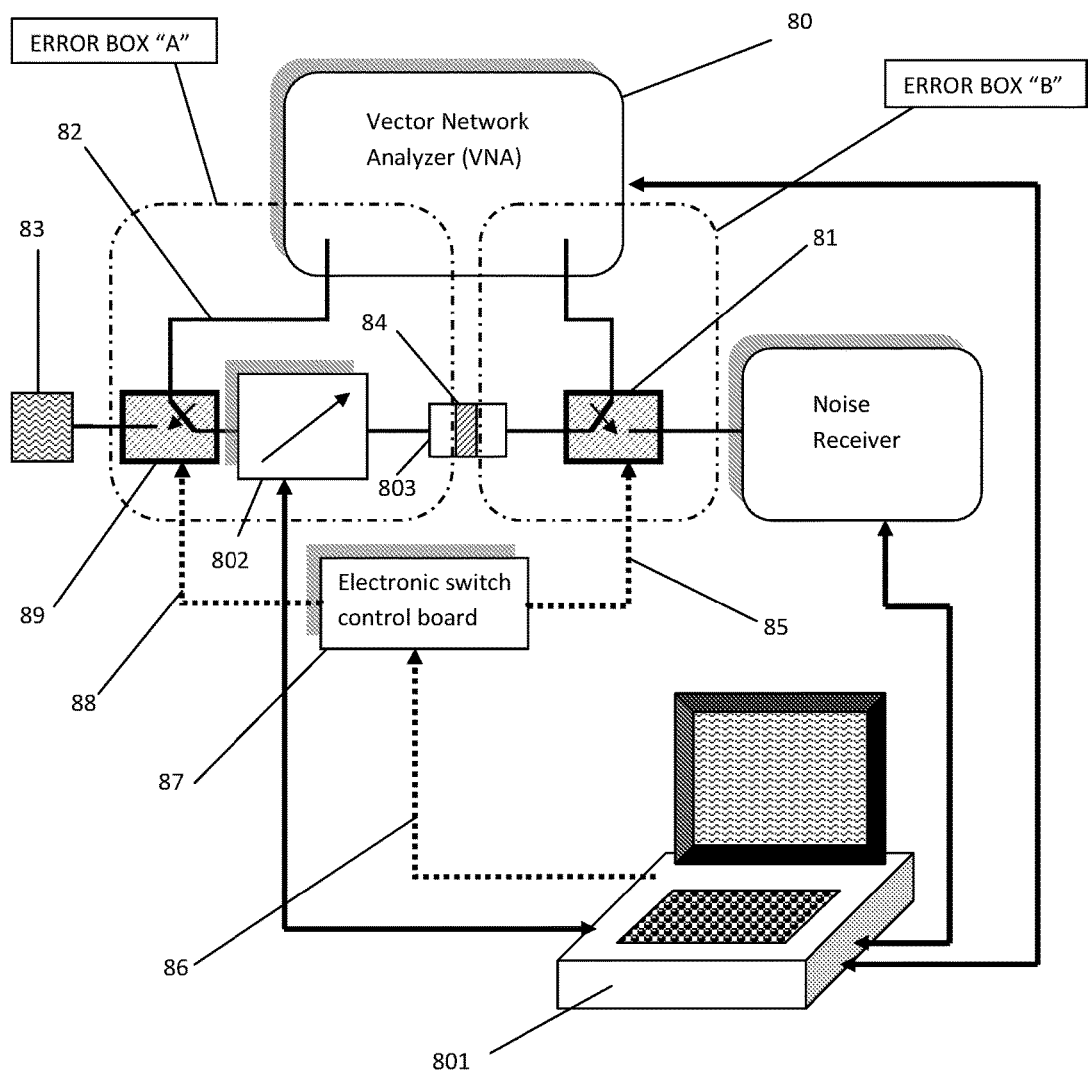
FIGURE 8: prior art

FIGURE 10: prior art

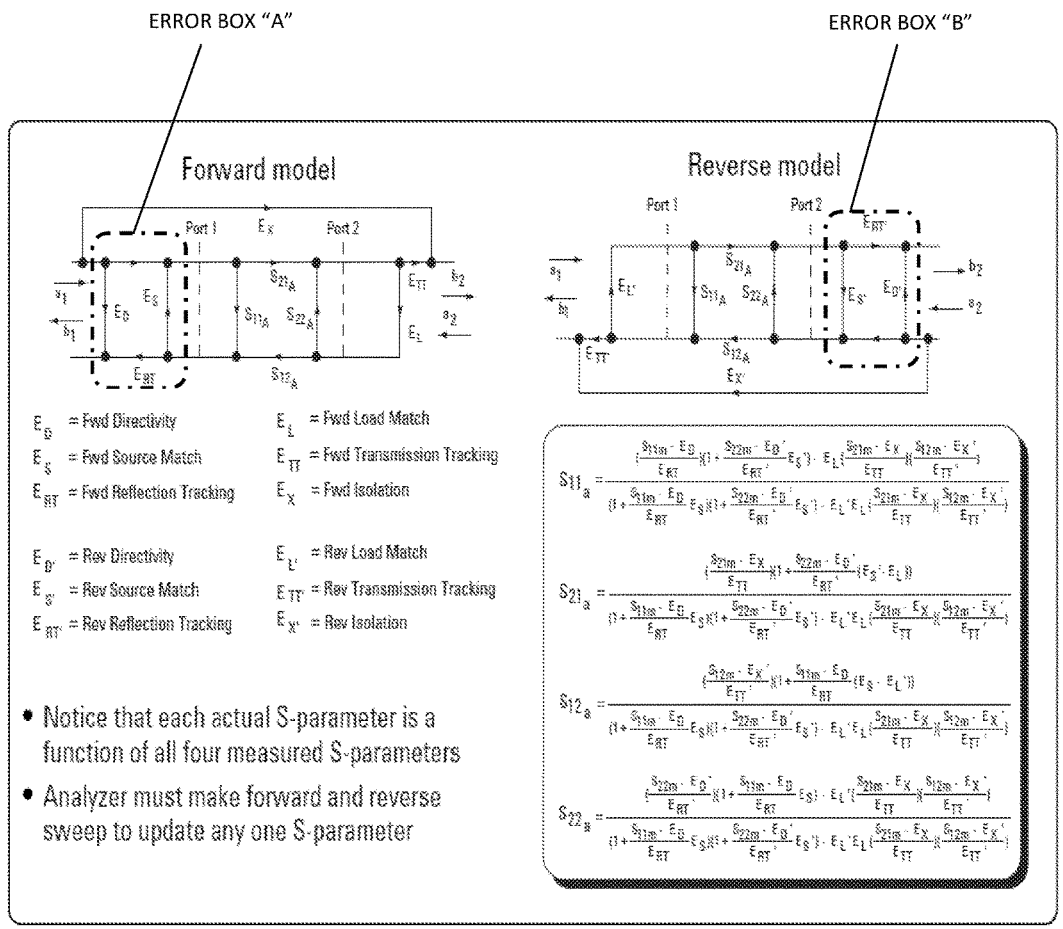
FIGURE 13: prior art

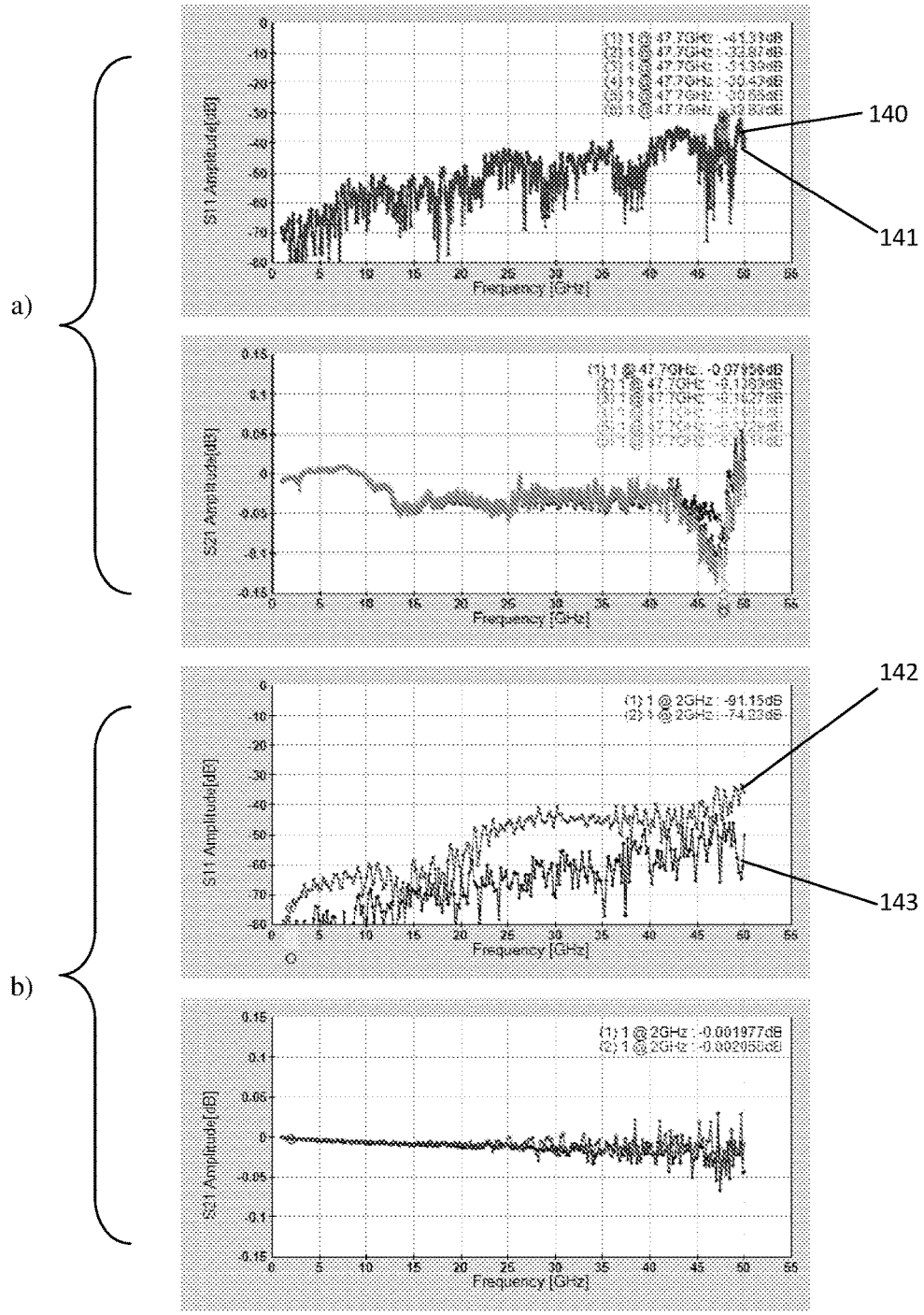
FIGURE 14: prior art

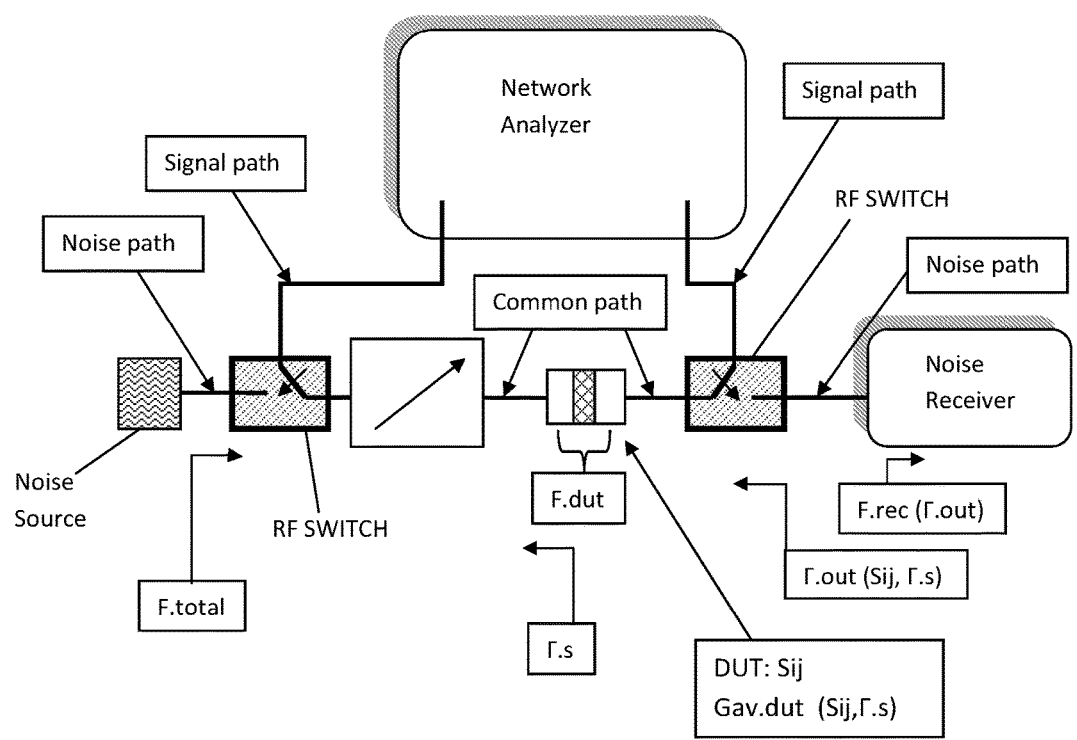
FIGURE 15: prior art

NOISE PARAMETER MEASUREMENT SYSTEM

PRIORITY CLAIM

This application claims priority on provisional application 61/873,008, filed on Sep. 3, 2013 titled: "NOISE PARAMETER MEASUREMENT SYSTEM".

CROSS-REFERENCE TO RELATED ARTICLES

1. H. ROTHE and W. DAHLKE, "Theory of noisy four poles", Proceedings of the IRE, June 1956, pages 811-818.
2. "FRIIS, formulas for noise", http://en.wikipedia.org/wiki/Friis_formulas_for_noise.
3. SISCHKA, Franz, "Basics of S-parameters, part 1", Characterization handbook, March 2002.
4. "Understanding Noise Parameter Basics/Understanding Noise Parameter Measurements", Application Note AN60-040, http://www.modelithics.com/literature.asp.
5. SIMPSON, G. "Data measurement methods and systems", US Provisional patent application US 2010/0030504 A1.
6. R. LANE, "The determination of Device Noise Parameters", Proceedings IEEE, vol. 57, pages 1461-1462, August 1969.
7. "Noise Figure Measurement Accuracy—The Y-Factor Method", Agilent Application Note 57-2, http://cp.literature.agilent.com/litweb/pdf/5952-3706E.pdf.
8. Agilent AN 1287-3, Applying Error Correction to Network Analyzer Measurements Available Gain in a transistor: EE 194 RF: page 4, equation 2.
9. TRL Calibration: ECE 451 Automated Microwave Measurements; Jose E. Schutt-Aine.

BACKGROUND OF THE INVENTION AND PRIOR ART

This invention relates to testing and characterization of low noise microwave and RF transistors and amplifiers (device under test, DUT); the method disclosed comprises a test setup for data acquisition and processing for extracting the "four noise parameters" of said DUT. The test setup uses automatic microwave tuners in order to synthesize reflection factors (or impedances) at the input of said DUT and allow collecting the necessary data using appropriate high sensitivity receivers.

All RF two-ports using semiconductor devices (DUT) contain internal noise sources which affect the purity of the signal entering at the input port and exiting (amplified) at the output port. A common way of characterizing the "purity" of the DUT at each frequency and bias condition is the noise figure: F. One definition of the noise figure is the degradation of the signal to noise ratio (S/N) between the input and output port of the DUT: $F=(S.in/N.in)/(S.out/N.out)$ (equation 1), whereby S.in and S.out are the signal power levels at the input and output of the DUT and N.in and N.out the corresponding noise power levels. Since the DUT adds to the transmitted signal its internal noise, the S/N ratio at the input is higher than at the output, therefore F>1.

It has been established (see reference 1) that four real numbers fully describe the noise behavior of any linear noisy two-port; these are the four noise parameters. By generally accepted convention the four noise parameters (4NP) are: Minimum Noise Figure (Fmin), Equivalent Noise Resistance (Rn) and Optimum Noise Admittance ($Yopt=Gopt+j*Bopt$) (see reference 1). The noise behavior of a two-port only depends on the admittance of the source and not of the load. The general relationship is: $F(Ys)=Fmin+Rn/Re(Ys)*|Ys-Yopt|^2$ (equation 2).

F(Ys) in equation 2 being the noise figure of the chain including the DUT and the receiver, the natural law of cascaded noisy two-ports described by FRIIS (see reference 2) is used to extract the noise figure of the DUT itself: FRIIS' formula is: $F.dut=F.total-(F.rec-1)/Gav.dut(Sij)$ (equation 3); hereby F.dut is the noise figure of the DUT, F.rec is the noise figure of the receiver and Gav.dut is the available Gain of the DUT for the given frequency and bias conditions. Whereas F.total can be measured directly (see reference 6) F.rec and Gav.dut depend both, (a) on the small signal properties of the DUT, which are customarily described using the s-parameters, and (b) on the source admittance Ys per equation 2 and reference 3; Sij are the DUT S-parameters (see reference 3).

During calibrations needed in order to extract the receiver noise figure in equation 3 and during measurements, when the signal flow is switched between noise path (516) and signal path (52) in FIG. 2, any mechanical switching repeatability error of the switches (53) and (510) will affect the result. This happens because the mechanical RF switches are part of the error-correction two-port, also called "error-box" (FIGS. 7 and 13); in that case, even good switches may create an error. This is due to the complex mathematical operations required in error-term component calculations (FIG. 13), which may amplify even small changes in measurement topology (switching changes the RF behavior of the measurement path, FIG. 6).

Commonly used prior art test setups are shown in FIGS. 1 and 2: Referring to prior art FIG. 1 the test system comprises: a calibrated noise source (52), an impedance tuner (60), a test fixture (10) to hold the DUT and a sensitive noise receiver (72). The tuner (60) and the noise receiver (72) are controlled by a system computer (not shown), which sets the source admittance Ys, created by the tuner, and retrieves digitally the associated noise measurement data from the noise receiver (72). After termination of the measurement session the computer program processes the measured data and extracts the four noise parameters of the DUT for a given frequency and DUT bias conditions. To measure DUT s-parameters the switches (54) and (64) are switched towards the network analyzer (70); to measure noise figure they are switched towards the noise source (52) and the noise receiver (72); it is this switching process which creates a measurement uncertainty and therefore a potential error, depending on the quality and repeatability of the switching process, since all calculations and corrections must assume that the switches are perfectly repeatable, which is rarely the case.

From equation 2 follows that, in order to determine the four noise parameters, one would have to take four measurements at four different source admittance values Ys. However, noise measurements are extremely sensitive and various disturbances cause measurement errors and uncertainties. It is therefore the accepted procedure to acquire more than four data points, at each frequency and extract the noise parameters using a linearization and error minimization technique. This method has been used and refined for many years (see reference 5 and FIGS. 1, 2 and reference 6) but is in general cumbersome and prone to insufficiencies, since the DUT may oscillate or the impedance tuner itself may create measurement errors, which are difficult to identify and eliminate if there are not enough data points to extract the four noise parameters from. The conclusion is that, to improve the reliability of the measurement one needs more data and elaborated extraction algorithms in order to deal with the noise parameter extraction problem as a statistical observation event.

In equation 3 the available gain of the DUT can only be calculated using the DUT s-parameters; these s-parameters must be accurate and measured, if possible immediately before the noise data acquisition, to avoid device drifting and allow calculations using equation 3. This is the reason for using RF switches in the measurement path (see reference 4 and FIGS. 1, 2). These switches allow fast toggling between the noise measurement path (516) and the s-parameter (signal) path (52) in FIG. 2. The problem is that those switches (see FIGS. 3 and 4) are not perfect. Their repeatability varies from unit to unit, deteriorates with increasing frequency and is limited (see FIG. 7); it may therefore create significant measurement errors and dispersion, both in DUT s-parameter measurement and noise measurement. This is due to the internal mechanics of the switches, as shown in FIGS. 5 and 6. As is shown in FIGS. 7 and 14 the repeatability of the switches itself is a potential source of error and affects the end result after calibrating the system.

This invention discloses a test setup that performs the same tasks as the traditional setup without using RF switches and the thereby associated un-correctable repeatability error.

DESCRIPTION OF THE DRAWINGS

The invention and its mode of operation will be more clearly understood from the following detailed description when read with the appended drawings in which:

FIG. 1 depicts prior art, the principle of noise parameter measurement system using RF switches.

FIG. 2 depicts prior art, a traditional noise parameter measurement setup also using RF switches.

FIG. 3 depicts prior art, a photograph of a commercially available SPDT switch.

FIG. 4 depicts prior art, the electrical equivalent of an RF switch.

FIG. 5 depicts prior art: a schematic view of the internal mechanism of an RF switch.

FIG. 6 depicts prior art: typical failure mechanisms in an RF switch.

FIG. 7 depicts prior art: typical schematic multiple switching repeatability of a) good RF switch, b) bad (worn out) RF switch.

FIG. 8 depicts prior art: a block diagram of a traditional noise measurement system using RF switches and associated s-parameter error term correction networks (Error Boxes).

FIG. 13 depicts prior art: The error term definitions and the required mathematical relations allowing the experimental computation of those.

FIG. 14 depicts prior art: measured examples of drifting in transmission (S21) and reflection (S11) coefficients of RF switches after several switching operations; a) good switch, b) bad switch.

FIG. 15 depicts prior art: the definitions of the RF components used in the noise measurement setup.

DETAILED DESCRIPTION OF THE INVENTION

Figure 9:
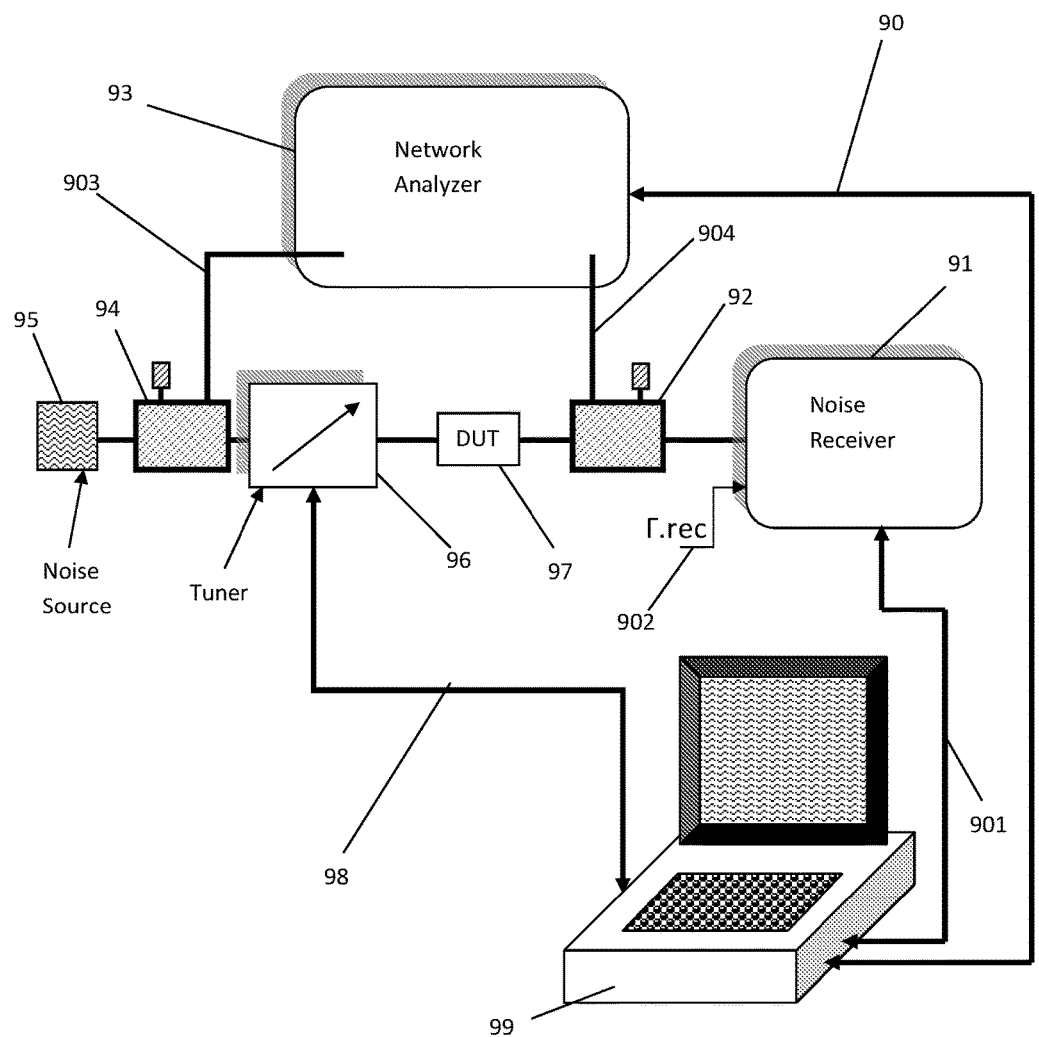
FIG. 9 depicts a block diagram of a noise measurement system using broadband directional couplers instead of RF switches.

The test setup disclosed here (FIG. 9) can be used instead of all hitherto used traditional setups (FIGS. 1, 2). The noise parameters of a DUT cannot be measured directly. Instead the noise figure (F.total) of the whole chain of tuner—DUT and receiver is measured and the noise figure (F.dut) is extracted. The relation allowing this is described by the FRIIS formula (see reference 2). F.dut=F.total−(F.rec−1)/Gav.dut (equation 3); herein F.rec is the noise figure of the receiver, which can be calculated as a function of the source admittance using the receiver four noise parameters and the output impedance of the DUT: F.rec=F.rec (Γ.out), because Γ.out of the DUT is the source impedance presented to the receiver (91); Gav.dut is the available gain of the DUT (97) at the specific frequency and bias conditions, which depends on the s-parameters of the DUT and the source impedance generated by the tuner (96). FIG. 15 shows the definitions of all quantities mentioned hitherto.

The complication arises due to the fact that, whereas F.total is a noise quantity measured directly, the other parameters (F.rec, Gav.dut) depend directly on the DUT RF parameters, which are best described using its s-parameters (scattering parameters); this can be seen directly as follows if we apply FRIIS' relation to the receiver itself:

$$F.rec = F.rec.min + Rn.rec/G.out * |Yopt.rec - Y.out|^2 \quad \text{(equation 4)};$$

and $$Gav.dut = |S21|^2 * (1 - |\Gamma.s|^2) / (|1 - \Gamma.s * S11|^2 * (1 - |\Gamma.out|^2)) \quad \text{(equation 5, see reference 8)},$$

whereby Γ.s is the source reflection factor, Y.out=G.out+jB.out is the output admittance of the DUT (which is the source admittance to the Receiver) and Γ.out is the reflection factor corresponding to Y.out, based on the relation Γ=(1−y)/(1+y) (equation 6), whereby y=Y/Yo, Y=G+jB and Yo=1/Zo=1/50 Ω=20 mS.

Considering that Γ.out=S22+(S12*S21*Γ.s)/(1−S11*Γ.s) (equation 7, see reference 8, page 4), equation 3 in its general form, because Γ.out is the source reflection factor for the receiver, can be written as:

$$F.dut = F.total - (F.rec(Sij, \Gamma.s) - 1)/Gav.dut(Sij, \Gamma.s); \quad \text{(equation 8)};$$

Hereby F.total is a directly measured noise quantity and all other components in equation 8 depend on both Γ.s and the DUT s-parameters Sij, with {i,j}={1,2}. Therefore any changing component when switching between the signal measurement path (s-parameters) and the noise measurement path (by changing Γ.s) will affect the measurement accuracy (see FIGS. 14 and 15).

As can be seen in FIG. 15, there are two changing components, both in the signal path and the noise path when toggling between noise and s-parameter measurement: the two RF switches. When measuring s-parameters (signal path) the switches are in position 1-2 (FIG. 4) and when measuring noise (noise path) the switches are in position 1-3. The source of measurement error is in the repeatability of the switches in going from position 1-2 to position 1-3; measured data are shown in FIG. 14 for a good (a) and a bad (b) switch. The actual problem is exuberated by the fact that even good switches do deteriorate over time.

As can be seen in FIGS. 5 and 6, which illustrate the typical internal mechanism of electro-mechanical RF switches, there are a number of possible errors: either dirt particles (debris) can be introduced in the switch contact (FIG. 6a) or the jumper contact can be pushed away by the vertical pressure and create contact error (FIG. 6b). In both cases the contact is or becomes (over time) unreliable and causes measurement uncertainly. FIG. 7 shows a schematic repeatability distribution error in transmission factor S21 or S31 of typical RF switches; comparing good (a) and bad (b) switches it is clear that an error will be created and will propagate through the measurement procedure as shown in equations 1 to 3 above. FIG. 14 shows measured repeatability results for only a single switch operation (measuring S21, switching from 1-2 to 1-3 and back to 1-2 and re-measuring S21) over a large frequency band for a good (140 to 141) and a bad (142 to 143) switch. This result represents a cause of unpredictable (random) measurement error.

FIG. 8 shows the calibration procedure of the signal path of the noise system. The VNA (80) is calibrated at the DUT reference plane (84). The calibration uses an error correction model (FIG. 13, see reference 7). The coefficients of the error correction model are calculated by inserting measurement standards at the DUT reference plane (84) and executing complex matrix calculations (FIG. 13). The result corresponds to two error correction term blocks, marked here as ERROR BOX "A" and ERROR BOX "B". The error correction boxes include hardware inside the VNA (80), the cables (82) the RF switches (81, 89) and the tuner (802) and the test fixture (803). Each of those components is described by its two-port s-parameter matrix [5]. It is very important that the mechanical geometry of each of those components does not change during calibration and after that, during measurement. This is typically done using a rigid setup and long flexible cables (82) in order to avoid stress during manipulations. However the RF switches (81, 89) must change position in order to allow switching between the "signal measurement path" and the "noise measurement path". It is imperative that the switches change as little as possible during this process. However this cannot be always guaranteed, as the plots in FIGS. 7 and 14 demonstrate.

It is impossible to determine the effect of randomly changing s-parameters of the switches. Even the most stringent specifications do not represent a 100% guarantee, simply because switching is a random phenomenon. Excellent switches (FIG. 14a) offer the best possibility for accuracy, with the, always present, possibility of random, uncorrectable error. In the case of worse switches (FIG. 14b) the measurement error is almost certain. Therefore an alternative solution is needed. For this directional couplers can be used (items (92) and (94) in FIG. 9) instead of RF switches (items (89) and (81) in FIG. 8).

Figure 10:
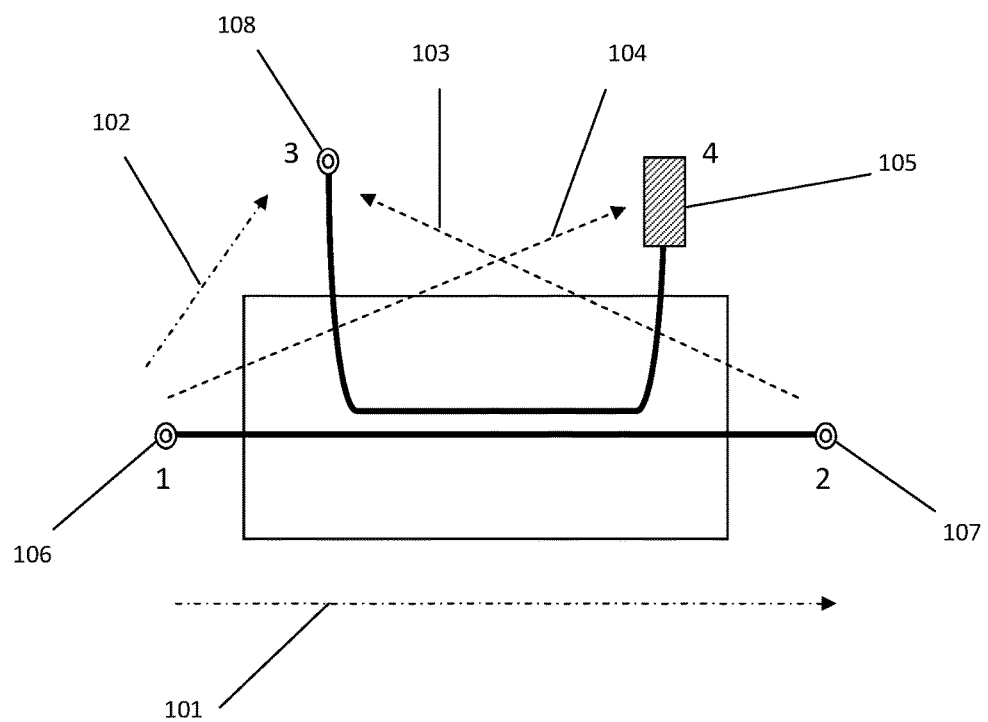
FIG. 10 depicts prior art: definition of s-parameters and coupling coefficients in a directional coupler.

A directional coupler is a three-port device (FIG. 10) that allows a sample of the signal traversing its main transmission line between ports 1 (106) and 2 (107) to be coupled in a contactless manner to the coupled port 3 (108). The ratio between the power injected into port 1 and the power extracted at port 3 is called the "coupling factor C" (102) and it is specified in dB; or C/dB=10*log (P3/P1), (equation 9). In fact C is <1, but the lab jargon always uses positive, instead of negative, dB numbers. Typical values are 6, 10, 20 and 30 dB. In the case of 20 dB, for instance, 1% of the injected power into port 1 goes to port 3 and 99% goes through to port 2. Of course there are transmission losses, so the power in port 2 is less than 99%. This is better seen as transmission factor S21 in FIGS. 7 (71, 72) and 14 (140, 142). In a 50 Ohm system (source impedance at port 1, load impedance at port 2 and load impedance at port 3 are all equal to the characteristic impedance Zo, typically=50 Ohm) the coupler is characterized by its three-port s-parameters {S11, S12, S13, S21, S22, S23, S31, S32, S33}. A coupler is a reciprocal device, i.e., S12=S21, S13=S31 and S23=S32. The coupled transmission line between ports 3 and 4 (FIG. 10) is terminated at port 4 with the characteristic impedance Zo (105). This allows power arriving at this port to be fully absorbed. The transmission of power between ports 1 and 4 (104) and between ports 2 and 3 (103) is undesired, but present, due to hardware limitations; these transmission factors are designated as "directivity D" and are an important characteristic of the couplers. Typical directivity values add to the coupling factor by 20 to 30 dB. i.e. if C=20 dB, and D=20 dB then the power ratio between what is injected in port 1 and what is absorbed in port 4 is: P4/P1=−40 dB or 0.0001, or 0.01%. Therefore the coupler is used as a three-port device and is characterized using only three-port s-parameters and not four-port s-parameters, even though in fact it is a four-port device.

Measuring using test equipment requires correction. Imperfections exist in even the finest test equipment and cause measurement errors. Some of the error factors are repeatable and predictable over time and temperature and can be removed, while others are random and cannot be removed. Vector Network Analyzer (VNA) error correction (see reference 7) uses the measurement of known electrical standards, such as a through connection, an open circuit, a short circuit, and a precision (50 Ohm) load impedance. The effect of error correction on displayed data can be dramatic. Without error correction, measurements show considerable ripple. The smoother, error-corrected trace produced by a twoport calibration subtracts the effects of systematic errors and better represents the actual performance of the device under test (DUT). A commonly used calibration procedure is Through-Reflect-Line (TRL). The effectiveness of this procedure has been shown in the past (see reference 9). Systematic errors are caused by imperfections in the test equipment and test setup. If these errors do not vary over time, they can be characterized through calibration and numerically removed during the measurement process. Systematic errors encountered in network measurements are related to signal leakage, signal reflections, and frequency response. There are six types of systematic errors:

a. Directivity and crosstalk errors relating to signal leakage especially in the directional couplers inside the VNA.

b. Source and load impedance mismatches relating to reflections.

c. Frequency response errors because of reflection and transmission tracking within the test receivers The full two-port error correction model includes all six of these terms for the forward direction and the same six (with different data) in the reverse direction, for a total of twelve error terms (FIG. 13). Random errors vary randomly as a function of time. Since they are not predictable, they cannot be removed by calibration. The main contributors to random errors are instrument noise (e.g., sampler noise, and the IF noise floor), switch repeatability, and connector repeatability. When using network analyzers, noise reading errors can often be reduced by increasing source power, narrowing the IF bandwidth, or by using trace averaging over multiple sweeps. The vector-correction process characterizes systematic error terms by measuring known calibration standards, storing these measurements within the analyzer's memory, and using this data to calculate an error correction model which is then used to remove the effects of systematic errors from subsequent measurements. This calibration process accounts for all major sources of systematic errors and permits very accurate measurements. The herein proposed new setup swaps a correctable error source i.e. the, unchanging, coupler leakage against a changing uncorrectable error source i.e.: the RF switch repeatability.

The new test setup is shown in FIG. 9: it comprises a noise measurement path and a signal measurement path; the noise path comprises a calibrated noise source (95), an input coupler (94) a remotely controlled impedance tuner (96), a device under test (97), an output coupler (92) and a noise receiver (91). The signal path serves in measuring the DUT s-parameters and calibrating the tuner; it comprises a vector network analyzer (93) and cables (903), (904) that connect to the coupled ports of the input and output couplers. I that sense the signal path and the noise path share the couplers (92) and (94), the tuner (96) and the DUT (97); the DUT block includes any necessary—not shown here for simplicity—bias networks and supply which are shown in prior art setups (items (56), (58) and (62) in FIG. 1 and items (55), (515) and (58) in FIG. 2). The main simplifications of the new setup of FIG. 9 versus prior art setup of FIG. 8 are:
  a. The switches (81) and (89) are replaced by couplers (92) and (94).
  a. The electronic switch control board (87) and control (86) are eliminated.
  b. Control connections to switches are eliminated (85) and (88).
  c. Software control in main computer is simplified.

The main advantage of the new setup though, beyond eliminating electronic and software control, is the elimination of the random error caused by the switch repeatability, shown in FIGS. 7 and 14. The implication introduced by the couplers is the limited isolation between noise and signal path, caused by the coupler directivity between the output port (107) and the coupled port (108) (FIG. 10); this is of the order of 40 dB ($10^{-4}$) instead of the isolation of the RF switch between ports (41) and (42) (FIG. 4) varying between 70 and 100 dB ($10^{-7}$ to $10^{-10}$). However, as is shown below, the systematic error associated with the coupler directivity is correctable, because it is not random.

Figure 11:
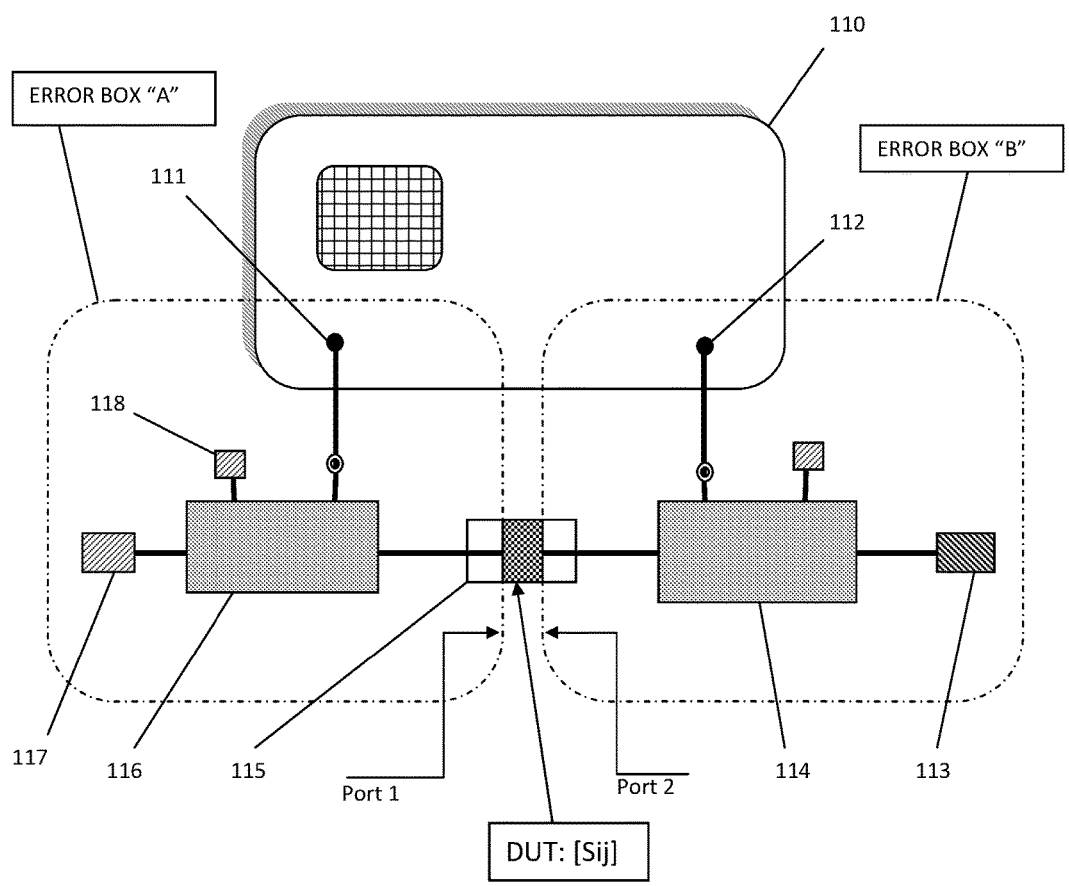
FIG. 11 depicts a calibration setup for the noise measurement system using broadband couplers.
Figure 12:
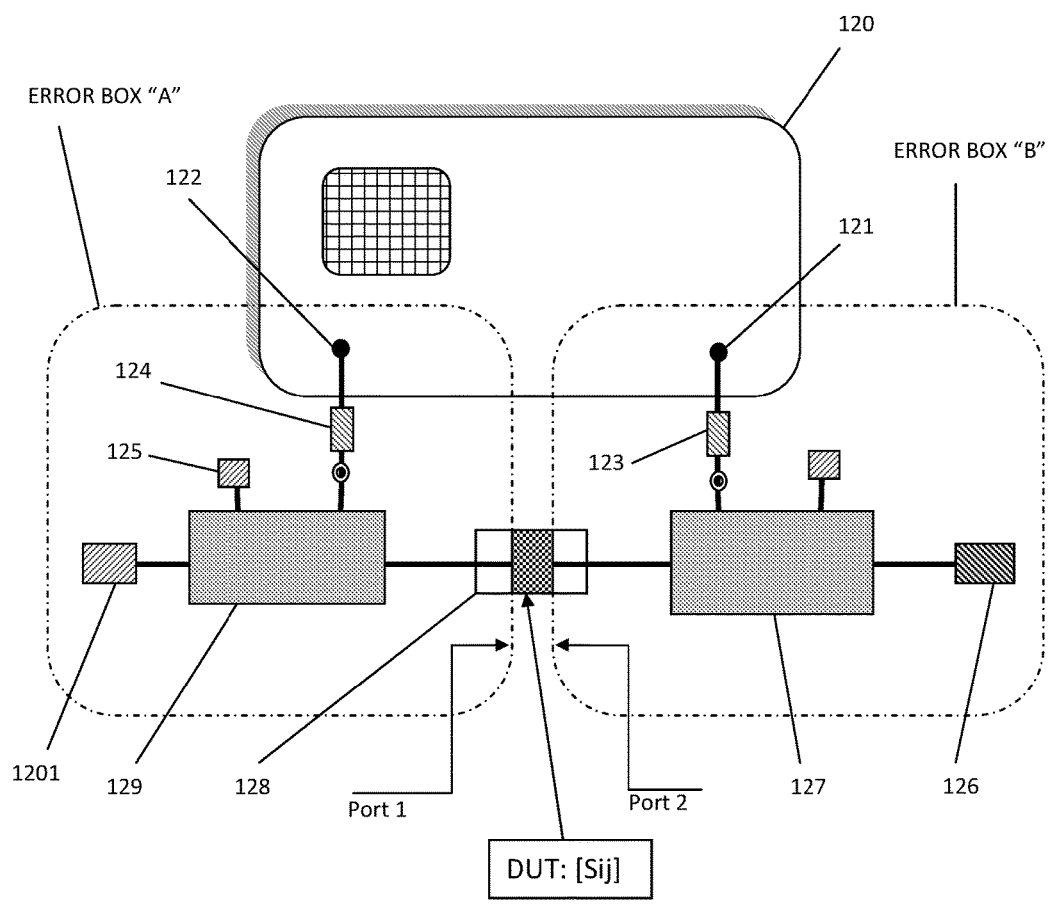
FIG. 12 depicts a block diagram of a noise measurement system using broadband directional couplers instead of RF switches and in series attenuators in the signal measurement path, to reduce the VNA signal power.

During measurement corrections the components comprised inside the stenciled frames ERROR BOX "A" and ERROR BOX "B" (FIGS. 11 and 12) replace the error correction boxes of the simple VNA calibration shown in FIG. 13. In FIG. 12 the VNA (120) is extended to include all components up to "port 1" and "port 2". What is inside the stenciled frames "ERROR BOX A" and "ERROR BOX B" become now part of the VNA calibration. Compared with the corresponding error box correction definitions in FIG. 8 (whereby the ERROR BOXES include the RF switches (89) and (81)) this is an accuracy improvement, because the ERROR BOXES in a calibration are not supposed to change during measurement, and between calibration and measurement, whereas, as already demonstrated, RF switches do change. During error box (TRL) calibrations the slide screw tuner (802) is initialized, i.e. the RF probes are withdrawn from the airline and the tuner represents a fixed transmission line. If another type of tuner is used, which does not have a transmission-line behavior at initialization, a fixed setting must be defined and used during TRL calibration and DUT s-parameter measurement; in this case the tuner s-parameters become part of error box A.

Since the signal path and the noise path are merged in the segment between couplers (FIG. 9), special attention must be paid not to inject signal power into the sensitive receiver (91) to avoid damage. This can be done by increasing the input (protection) attenuator of the receiver (91). Depending on the dynamic range of the VNA (93) and its power control range, additional fixed attenuators (123, 124) can be used in the signal path lines (see FIG. 12); the setup of FIG. 12 is, otherwise, identical with the setup of FIG. 11. During noise measurements the signal power of the VNA must be totally cut-off.

After the error correction boxes A and B have been determined, using TRL calibration of the VNA, the DUT s-parameters as well as the tuner calibration are possible. For DUT s-parameter measurements the tuner is simply initialized (RF probes are withdrawn and the tuner represents a simple transmission line between its input and output ports) and error correction box A and B s-parameters are de-embedded to extract the DUT s-parameters. For tuner calibration (which occurs only once at the setup configuration) the DUT is replaced by a THROUGH LINE and measurements are made at the DUT reference plane, for a multitude of RF probe positions, and saved in a calibration file for later use.

In the case of prior art (FIGS. 1 and 2) the bias networks (56) and (58) in FIG. 1 and (55) and (515) in FIG. 2, must be inserted between DUT (10) in FIG. 1, (514) in FIG. 2, and RF switches (54) and (64) in FIG. 1 and (53) and (510) in FIG. 2; this is because the DUT must remain biased at all times, whether we measure noise or s-parameters. If directional couplers are used (92) and (94) in FIG. 9, instead of RF switches, the bias networks can be placed either between the couplers and the DUT or between the couplers and the noise source (95) and the receiver (91), because the DUT will always be biased through the main transmission line in the couplers (106)-(107) in FIG. 10. In fact placing the bias networks outside the error correction boxes A and B (FIG. 11) and having them included as part of the source (117) and load (113) impedances simplifies the error term calculations: this is obvious because the inherent reflections and losses of the bias networks mask to some extend the DUT, if inserted in the signal measurement path, and make the extraction of the correction terms more sensitive to reading errors. Hereby, and for practical reasons, like avoidance of spurious oscillations and assuming that all associated calibrations and error term corrections are executed in consequence, it is possible to insert the bias networks in various positions in the chain as follows:
  a) Input bias network between noise source (95) and input coupler (94) at the input and output bias network between output coupler (92) and receiver (91) at the output;
  b) input bias network between input coupler (94) and tuner (96) at the input and output bias network between output coupler (92) and receiver (91) at the output;
  c) input bias network between noise source (95) and input coupler (94) at the input and output bias network between output coupler (92) and noise receiver (91) at the output.

Obvious alternatives to the disclosed noise parameter test setup using wideband couplers allowing in-situ tuner calibration and s-parameter measurements of the DUT together with noise measurements are possible but shall not impede on to the validity of the present invention.

What I claim as my invention is:

1. A computer controlled noise parameter measuring system comprising,
  a noise signal measurement path and a scattering (s-) parameter measurement path,
  whereby both paths are permanently joined using directional couplers;

said noise measurement path comprising a cascade of calibrated noise source, input directional coupler, input bias network, impedance tuner, device under test (DUT) mounted in a test fixture, output bias network, output directional coupler and noise receiver, and whereby the s-parameter measurement path comprises a vector network analyzer (VNA) and shares the couplers, bias networks, test fixture and DUT with the noise measurement path, whereby the s-parameter path joins the noise path through the coupling ports of the couplers.

2. A test system as in claim 1, wherein each coupler has input port, output port and coupled port, and whereby the s-parameter signal travels from the first VNA port to the coupled port and then to the output port of the first coupler, then to the input port of the test fixture, the DUT, the output port of the test fixture, to the input port and then to the coupling port of the second coupler and back to the second VNA port;

and whereby the noise signal travels from the noise source to the noise receiver hereby traversing the bias networks, the test fixture, the DUT and the couplers from their the input to their output ports.

3. A test system as in claim 2, whereby the test equipment and tuner are controlled by a system computer.

4. A test system as in claim 2, wherein said test fixture is a wafer probe station.

5. A test system as in claim 2, wherein said test fixture is a microstrip transistor test fixture.

6. A test system as in claim 2, wherein said test fixture is a coaxial transistor test fixture.

7. A test system as in claim 2, whereby the noise measurement path comprises a cascade of components as follows:

the noise source is connected with the RF port of the input bias network;

the RF&DC port of the input bias network is connected with the input port of the input coupler;

the output port of the input coupler is connected with the input port of the tuner;

the output port of the tuner is connected with the input port of the test fixture;

the output port of the test fixture is connected with the input port of the output coupler;

the output port of the output coupler is connected with the RF&DC port of the output bias network;

the RF port of the output bias network is connected with the noise receiver.

8. A test system as in claim 2, whereby the noise measurement path comprises a cascade of components as follows:

the noise source is connected with the input port of the input coupler;

the output port of the input coupler is connected with the RF port of the input bias network;

the RF&DC port of the input bias network is connected with the input port of the tuner;

the output port of tuner is connected with the input port of the test fixture;

the output port of the test fixture is connected with the RF&DC port of the output bias network;

the RF port of the output bias network is connected with the input port of the output coupler;

the output port of the output coupler is connected with the noise receiver.

9. A test system as in claim 7 or 8 whereby the bias networks have three ports: a RF port, a DC port and a RF&DC port.

* * * * *